(12) United States Patent
Shen et al.

(10) Patent No.: US 6,463,782 B1
(45) Date of Patent: Oct. 15, 2002

(54) SELF-CENTERING CALIBRATION TOOL AND METHOD OF CALIBRATING

(75) Inventors: Chia-I Shen, Kaoshiung (TW); Jan-Mei Fan, Hsin Chu Hsien (TW); Su-Hwa Wang, Hsin-Chu (TW); Hui-Lung Hon, Kaoshiung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/483,044

(22) Filed: Jan. 13, 2000

(51) Int. Cl.[7] .............................................. B65G 65/00
(52) U.S. Cl. ....................................................... 73/1.79
(58) Field of Search ................................ 73/1.01, 1.75, 73/1.79, 1.81, 1.78

(56) References Cited

U.S. PATENT DOCUMENTS 4,372,721 A * 2/1983 Harjar et al. ................ 73/1.75
6,032,512 A * 3/2000 Li
6,075,334 A * 6/2000 Sagues et al.

* cited by examiner

Primary Examiner—Robert Raevis
(74) Attorney, Agent, or Firm—Tung & Associates

(57) ABSTRACT

A self-centering calibration tool for a wafer platform or a heater in a chemical vapor deposition chamber is disclosed. The self-centering calibration tool is constructed of a circular calibration disc that has at least one alignment mark on a top surface for aligning a robot arm, and a centering device mounted juxtaposed to a bottom surface of the disk. The centering device is detachably mounted to the calibration disk by a bolt threadingly engaging a center aperture in a calibration disk and a center aperture in the centering device. The centering device is constructed by at least three links, or legs extending radially outwardly from the center aperture equally spaced circumferentially from each other adapted for engaging an undercut groove provided in a raised edge of the wafer platform to effectuate a self-centering calibration. A method for calibrating the movement of a robot arm for loading a wafer onto a wafer platform or a heater is also disclosed.

18 Claims, 2 Drawing Sheets

SELF-CENTERING CALIBRATION TOOL AND METHOD OF CALIBRATING

FIELD OF INVENTION

The present invention generally relates to a self-centering calibration tool and a method for calibrating a wafer platform and more particularly, relates to a self-centering calibration tool that is equipped with a centering device having at least three legs extending radially outwardly from a center aperture for engaging a wafer platform to effectuate a self-centering calibration and a method for calibrating a wafer platform.

BACKGROUND OF THE INVENTION

In the fabrication of semiconductor devices, metal contacts and vias are frequently formed in contact holes and via openings on silicon wafers that have been pre-processed with insulating layers on top. Devices are then fabricated by connecting the components with metal contacts and vias to form the integrated circuits. In particular, aluminum, aluminum alloys, tungsten and tungsten alloys are frequently used for depositing into contact holes and via openings on silicon substrates. The deposition process can be carried out either in a physical vapor deposition chamber or in a chemical vapor deposition chamber.

As the dimensions of semiconductor devices continuously to shrink in the miniaturization of modem semiconductor devices to the sub-half-micron range, via openings and contact holes must also shrink. Consequently, the opening and holes to be filled have larger aspect ratios, i.e., the ratios between the depth of the opening or hole and the diameter.

Difficulties have been encountered in depositing conductive metal into via openings and contact holes as they become smaller and deeper, the bottom and sides of an opening or hole receive fewer deposited metal particles than the top surfaces of the device. The end result of such a phenomenon, sometimes called a shadowing effect, is that metal layers formed by the particles hang over the opening forming an overhang. The overhang closes before the opening is completely filled as the deposition process progresses and thus creating a void in the opening or hole.

One techniques used to remedy the shadowing effect of the sputtering process is to use a tungsten chemical vapor deposition (W CVD) technique for filing openings and holes that have large aspect ratios. The W CVD process solves the difficult problem in metalization to ensure enough metal continuity in contact windows and vias. The step coverage of deep openings or holes by the W CVD particles is greatly improved over that possible by any other deposition technique. The basic chemistry is represented by:

$$WF_6 + 3H_2 \rightarrow W + 6HF \quad \text{(Equation A)}$$

$$2WF_6 + 3Si \rightarrow 2W + 3SiF_4 \quad \text{(Equation B)}$$

There may also be reactions between $WF_6$ and $SiH_4$ and furthermore, $WF_6$ may be reduced by Ai and Ti through different chemical processes.

During a W CVD deposition process, a wafer is usually held on a vacuum chuck that is heated to a temperature between about 400° C. and about 500° C. A shower head is positioned opposite to the wafer where $WF_6$, $H_2$ or $SiH_4$ gases are injected. Normally, a two or three-step process is involved where $SiH_4$ is first introduced without any flow of $WF_6$ to initiate a deposition of a very thin seed layer amorphous silicon as a prenucleation layer. The nucleation process is then followed by $SiH_4 + WF_6$ silane reduction nucleation process for depositing a thin W nucleation layer and then the faster-rate $H_2 + WF_6$ hydrogen reduction process for bulk W deposition. During the nucleation stage, less than 100 nm of tungsten is deposited, while the bulk of the tungsten deposition is by the hydrogen reduction process. The multi-stage deposition process is designed such that during the initial nucleation stage, the silicon from the source/drain area is not consumed in the reaction since $WF_6$ would react readily with Si. When $WF_6$ reacts with Si from the source/drain region, a defect known as junction leakage may occur. The introduction of $SiH_4$ into the reaction avoids the consumption of Si from the substrate. The initial introduction of $SiH_4$ into the reaction without $WF_6$ for the deposition of the prenucleation layer of Si is known as a silane soak step.

In the W CVD process, a W CVD is frequently blanket-deposited onto a wafer surface and into the contact holes after a metal nucleation layer is first deposited on the entire wafer. The W deposited on the insulating layer, i.e. a $SiO_2$ layer, is then etched off in an etchback process by a process of reactive ion etching. After the etchback process, only the thicker W in the contact holes are left. Since the process relies on the removal of all W CVD except in the contact holes, the uniformity of the W deposition and the RIE etchback process is critical for the successful formation of W contact plugs. When the process is not accurately controlled, such as with the pre-deposition of a nucleation layer of Ti/TiN, the W contact plugs may be substantially recessed after the etchback process and thus results in poor step coverage on the device.

In the deposition of contact plugs by the W CVD method, the process chamber utilized must be cleaned on a preventive maintenance schedule. Such preventive maintenance schedule is frequently performed on a monthly basis. After the process chamber and the components inside the chamber are cleaned, the wafer transport system, including a robot arm must be recalibrated according to the position of the wafer platform inside the chamber. The robot transport calibration, or commonly known as the hand-off procedure, must be performed at the tungsten plug deposition temperature, i.e. at about 440° C. Due to the large thermal expansion coefficients of the chamber components including those made of quartz and stainless steel, the robot transport calibration for wafer positioning must be carried out in its work environment, i.e. at the high deposition temperature. Any calibration procedure conducted at room temperature would be inaccurate when the robot transports at high temperatures.

To carry out the calibration process at the 440° C. high temperature after a preventive maintenance procedure, a quartz cover, i.e. a transparent cover, must first be placed on the CVD machine and then the process chamber is evacuated. The temperature of the process chamber is then ramped up to the process temperature of 440° C. which requires between 2~3 hours. The calibration procedure can then be carried out by loading a dummy wafer into the process chamber and placing on top of the wafer platform (or the heater), and its accuracy in positioning is checked and adjusted for the robot arm. The temperature is then ramped down to room temperature such that the quartz cover can be removed after the chamber is vented. The ramp down process also requires 2~3 hours. The total calibration process therefore requires a minimal of 6 hours which is extremely time consuming and wasting of machine process time.

As a result, a hand-off calibration tool is provided by the machine manufacturer for performing calibration at room temperature. This is shown in FIGS. 1A–1E. The hand-off calibration tool 10, shown in FIG. 1A is formed by two disks 12, 14 that are of different diameters. Four calibration apertures 16 are provided for performing a visual calibration of the robot transport system (not shown). The upper disk 12 further includes apertures 18 for lift pins for lifting a wafer positioned thereon, and apertures 20 for guide pins for the positioning of a wafer onto the wafer platform 30. A total of four apertures 18 are provided for the lift pins, while a total of six apertures 20 are provided for the guide pins. The upper disk 12 is further provided with a slot opening 22 in its top surface 24. A plane view of the hand-off tool 10 is shown in FIG. 1B.

A perspective view of a wafer platform, or a heater 30 is shown in FIG. 1C. The wafer platform 30 is supported by a base portion, a shaft 32 for providing up-and-down motion of the wafer platform 30. In a top surface 34 of the platform 30, six apertures 36 are provided for the guide pins (not shown) while four apertures 38 are provided for the lift pins (not shown). The top surface 34 of the wafer platform 30 is adapted for engaging the bottom surface 26 of the bottom disk 14 of the hand-off tool 10. This is shown in FIG. 1D. An undercut groove 40 is further provided in a raised edge 42 which projects upwardly from the top surface 34 of the wafer platform 30. As shown in FIG. 1E, the height of the raised edge 42 is at least 1 mm and preferably about 2 mm. The "about" used in the context of this write-up indicates a range of ±10% from the average value given.

A plane view of the hand-off tool 10 (similar to that shown in FIG. 1B) and a side view of the tool 10 are further shown in FIGS. 2A and 2B. These views are shown for ready comparison with the present invention apparatus shown in FIGS. 3A–3C. A locating pin 28 is further shown in FIGS. 2A and 2B to facilitate the calibration procedure with the robot transport arm.

In a conventional wafer platform 30 as shown in FIG. 1C, the platform surface 34 fits a wafer snugly only when the platform is heated to its high processing temperature of 440° C. During a preventive maintenance procedure where the temperature of the chamber and the wafer platform 30 is dropped to room temperature, a calibration of the robot transport arm cannot be conducted on the wafer platform 30 since a wafer no longer fits on the platform surface 34 inside the raised edge 42. At the high process temperature, the platform surface or the heater surface 34 expands to allow the wafer to fit inside the raised edge 42 by guide pins (not shown) inside the apertures 36.

During a preventive maintenance procedure, a chemical vapor deposition chamber is first disassembled and the chamber components are allowed to cool to room temperature. After the maintenance procedure is completed, in order to calibrate the wafer transfer robot arm, the quartz cover of the chamber must be repositioned on the chamber so that vacuum may be formed inside the chamber. The temperature in the process chamber is then ramped up to the tungsten deposition temperature of about 440° C. After the temperature is reached in the chamber, a wafer loading procedure is conducted to load a wafer onto the surface of the heater (or the platform) and the position of the robot transport arm is calibrated to insure the accurate placement of the wafer onto the heater. After the calibration is completed, the temperature of the process chamber is dropped to room temperature to carry out other maintenance steps. The conventional calibration procedure for the robot transport arm performed at high process temperature is therefore a time consuming process and requires a significant amount of machine down time. The problem is not solved by using a manufacturer supplied calibration tool, i.e. the hand-off tool shown in FIGS. 2A and 2B since the calibration can only be visually performed through calibration apertures 18.

It is therefore an object of the present invention to provide a self-centering tool for a wafer platform that does not have the drawbacks or shortcomings of the conventional tools.

It is another object of the present invention to provide a self-centering calibration tool for a wafer platform that incorporates a centering device mounted on a calibration disk.

It is a further object of the present invention to provide a self-centering calibration tool for a wafer platform wherein a centering devices is detachably mounted to a calibration disk by a bolt threadingly engaging a center aperture in the disk.

It is another further object of the present invention to provide a self-centering calibration tool for a wafer heater in a chemical vapor deposition chamber that allows a wafer transport robot be calibrated at room temperature.

It is still another object of the present invention to provide a self-centering calibration tool for a wafer heater in a chemical vapor deposition chamber that utilizes a centering device that includes at least three legs extending radially outwardly from a center aperture equally spaced circumferentially from each other.

It is yet another object of the present invention to provide a self-centering calibration tool for a wafer heater in a chemical vapor deposition chamber that utilizes a centering device for engaging an undercut groove provided on the wafer heater.

It is still another further object of the present invention to provide a method for calibrating the movement of a robot arm for loading/unloading a wafer onto a wafer platform by using a calibration disk equipped with a self centering device for engaging a top surface of the wafer platform.

It is yet another further object of the present invention to provide a method for calibrating the movement of a robot transport arm for loading a wafer onto a wafer heater in a chemical vapor deposition chamber by engaging a centering device mounted on a calibration disk to an undercut groove provide on the heater surface.

SUMMARY OF THE INVENTION

In accordance with the present invention, a self-centering calibration tool and a method for calibrating a wafer platform are disclosed.

In a preferred embodiment, a self-centering calibration tool for a wafer platform is provide which includes a circular wafer platform adapted for holding a wafer thereon, the platform has a raised edge projecting upwardly from a top surface of the platform, the raised edge has an undercut groove facing the center of the platform, and a circular calibration disk that has at least one alignment mark on a top surface for aligning a robot arm and a centering device mounted juxtaposed to a bottom surface. The centering device is detachably mounted to the circular calibration disk by a bolt threadingly engaging a center aperture in the calibration disk and a center aperture in the centering device, the centering device may include at least three legs extending radially outwardly from the center aperture equally spaced circumferentially from each other adapted for engaging the undercut groove in the wafer platform effectuating a self-centering calibration.

In the self-centering calibration tool for a wafer platform, the circular wafer platform may be supported by a shaft portion for moving upwardly and downwardly. The top surface of the circular wafer platform may include a plurality of apertures adapted for slidingly engaging a plurality of lift pins. The top surface of the circular wafer platform my further include a plurality of apertures adapted for engaging a plurality of guide pins. The undercut groove in the raised edge may have a thickness of at least 1 mm. The undercut groove in the raised edge may further include outlets for a cooling gas. The at least three legs of the centering devices are bent at an angle of at least 30° when measured from a radius drawn from the center aperture of the centering device. The at least three legs of the centering device may be bent at an angle of at least 60° when measured from a radius drawn from the center aperture of the centering device. The wafer platform may be one that is used in a tungsten chemical vapor deposition chamber. The center apertures for the calibration disk and for the centering device are provided with threads.

The present invention is further directed to a method for calibrating the movement of a robot arm for loading a wafer onto a wafer platform that can be carried out by the operating steps of providing a circular wafer platform adapted for holding a wafer thereon, the platform has a raised edge projecting upwardly from a top surface of the platform, the raised edge has an undercut groove facing a center of the platform, providing a circular calibration disk that has at least one alignment mark on a top surface and a centering device mounted juxtaposed to a bottom surface, the centering device is detachably mounted to the circular calibration disk by a bolt threadingly engaging a center aperture in the calibration disk and a center aperture in the centering device, the centering device may include at least three legs extending radially outwardly from the center aperture equally spaced circumferentially from each other, engaging the at least three legs in the undercut groove situated in the wafer platform to effectuate a self-centering calibration, and calibrating a movement of a robot arm for loading a wafer onto the wafer platform.

The method for calibrating the movement of a robot arm for loading a wafer onto a wafer platform may further include the step of providing the circular platform in a chemical vapor deposition chamber. The method may further include the step of calibrating a movement of the robot arm for placing a silicon wafer onto the wafer platform. The method may further include the step of deforming the at least three legs on the centering device to an angle of at least 30° when measured from a radius drawn from the center aperture. The method may further include the step of deforming the at least three legs on the centering device to an angle of at least 60° when measured from a radius emanating from the center aperture. The method may further include the step of raising a plurality of lift pins in the wafer platform to unload a wafer positioned thereon. The method may further include the step of providing a plurality of openings in the undercut groove and flowing a cooling gas therethrough. The method may further include a step of evacuating air from the chemical vapor deposition chamber such that a pressure of not higher than $10^{-4}$ Torr is maintained in the chamber.

BRIEF DESCRIPTION OF THE DRAWING

These and other objects, features and advantages of the present invention will become apparent from the following detailed description and the appended drawings in which.

DETAILED DESCRIPTION OF THE PREFERRED EMBODIMENT

The present invention discloses a self-centering calibration tool for a wafer platform situated in a process chamber and a method for calibrating a wafer transport robot in relation to a wafer platform situated in a process chamber.

In the present invention novel self-centering calibration tool for a wafer pedestal, a centering device is added to the base portion of a calibration disk for achieving a self-centering calibration. The centering device consists of at least three sets of links, i.e. legs at the calibration tool base, or at the hand-off tool base to improve the calibration process for a wafer transport robot at low temperature. By utilizing the present invention novel calibration tool, the process chamber does not have to be ramped up to a high process temperature in order to conduct an accurate calibration process. The present invention novel calibration tool does not rely on visual examination of the position of the hand-off tool, unlike that required for the conventional calibration tool. The self-centering function of the present invention novel calibration tool is achieved by at least three legs emanating from a center aperture of the centering device that are spaced-apart equally in a circumferential direction. The three legs extending radially outwardly from the center aperture are adapted for engaging and undercut groove provided in a raised edge portion of the wafer platform to effectuate a self-centering calibration.

Figure 2A:
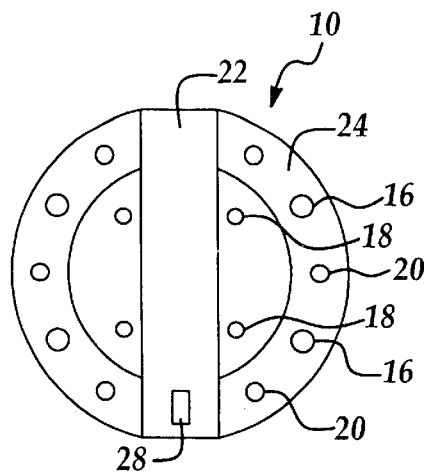
FIG. 2A is a plane view of the conventional hand-off calibration tool similar to that shown in FIG. 1B.
Figure 2B:
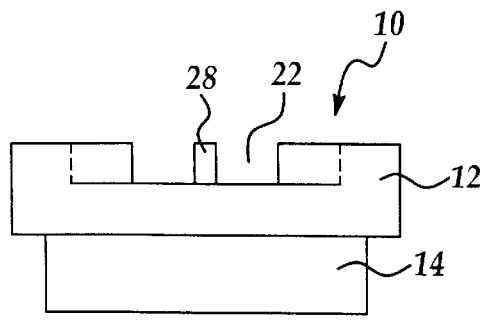
FIG. 2B is a side view of the conventional hand-off calibration tool shown in FIG. 2A.
Figure 3A:
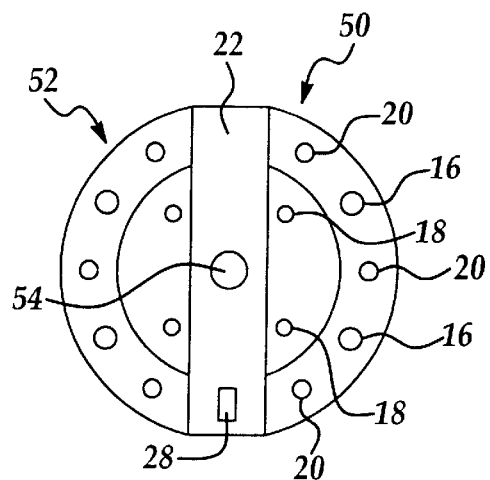
FIG. 3A is a plane view of the present invention hand-off calibration tool equipped with a self-centering device.
Figure 3B:
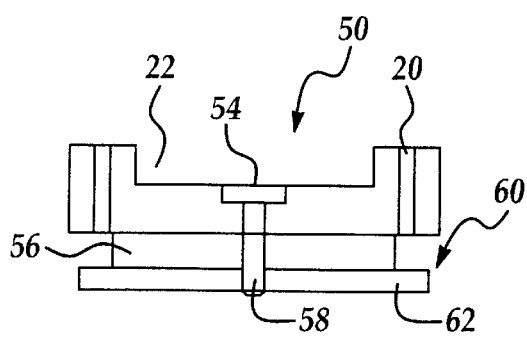
FIG. 3B is a cross-sectional view of the present invention hand-off calibration tool of FIG. 3A.
Figure 3C:
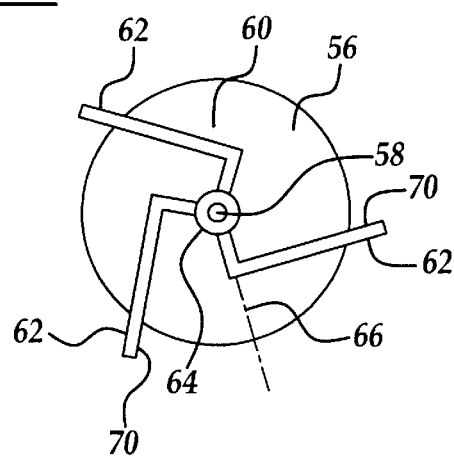
FIG. 3C is a plane view of the present invention self-centering device that is mounted to the bottom of a hand-off calibration tool.

Referring now to FIGS. 3A–3C, wherein a present invention self-centering calibration tool 50 equipped with a self-centering device 60 is shown. In the plane view of FIG. 3A, the upper disk 52 is shown which is substantially similar to that shown in FIG. 2A except that a center aperture 54 is provided at the center of the disk 52. The aperture 54 is a through hole adapted for a bolt 58 to penetrate therethrough and to threadingly engaging a center aperture 64 in the centering device 60. The center aperture 64 is therefore provided with threads to engage the bolt 58. At least three links, or legs 62 are connected at the center aperture 64 extending radially outwardly from the center aperture equally spaced circumferentially from each other. As shown in FIG. 3C, the at least three legs 62 of the centering device 60 are bent at an angle of at least 30° when measured from a radius 66 shown in FIG. 3C. The centering device 60, when installed by bolt 58, is positioned abutting a lower disk 56 of the centering device 50.

Figure 1A:
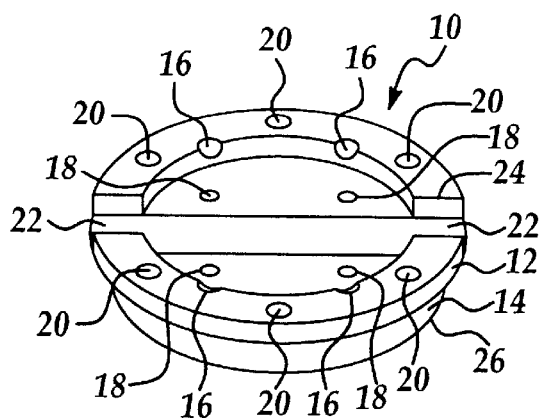
FIG. 1A is a perspective view of a conventional hand-off tool for calibrating a wafer transport robot arm in reference to a wafer platform.
Figure 1B:
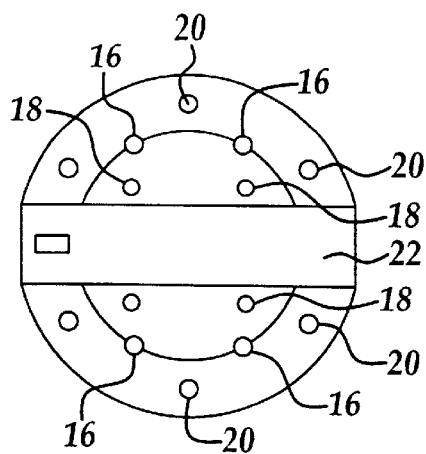
FIG. 1B is a plane view of the conventional hand-off calibration tool shown in FIG. 1A.
Figure 1C:
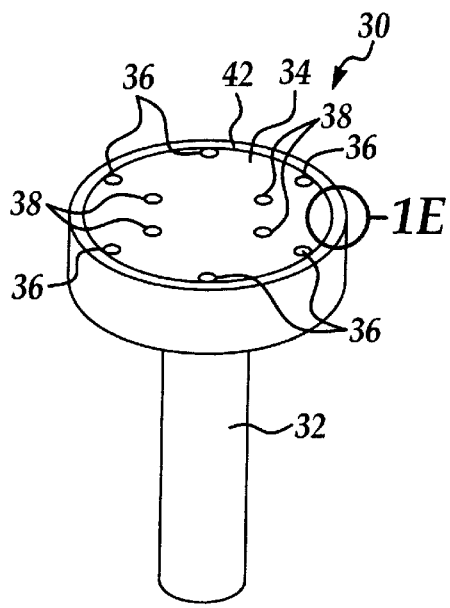
FIG. 1C is a prospective view of a conventional wafer platform supported on a shaft.
Figure 1D:
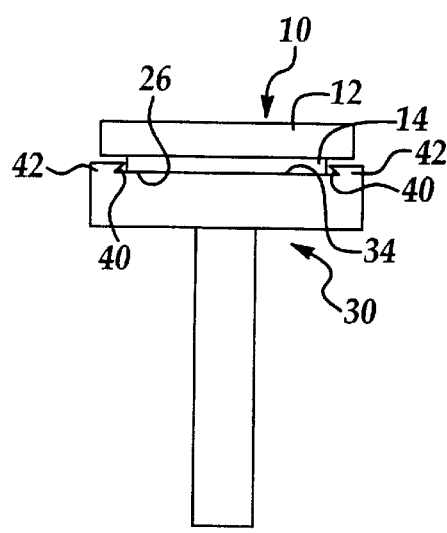
FIG. 1D is a side view of the wafer platform of FIG. 1C with the conventional hand-off calibration tool positioned on top.
Figure 1E:
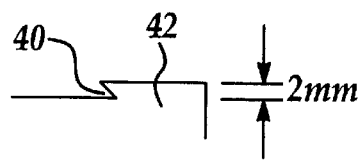
FIG. 1E is a cross-sectional view of the undercut groove portion of the raise edge shown in FIG. 1C.

As shown in FIG. 3C, it should be noted that the angle of the bent leg formed with the radius 66 may be suitably set at at least 30°, and preferably at at least 60°. The tip portions 70 of the bent legs 62 engage the undercut groove 40 (shown in FIG. 1E) thus achieving the self-centering function.

In practicing the present invention novel method for calibrating the movement of a robot arm for loading a wafer onto a wafer platform, the procedure can be carried out by first mounting the present invention calibration tool on the wafer pedestal (or heater). The mounting is accomplished by mounting a bolt through the aperture in the wafer pedestal into a threaded aperture in the centering device. The three links (or legs) of the centering device are then fitted into the undercut groove in the raised edge of the wafer platform to insure that the calibration tool is perfectly centered on the wafer platform. The quartz cover for the chemical vapor deposition chamber is then mounted on the chamber and air is withdrawn from the chamber to achieve the process vacuum. The wafer transport robot arm is then calibrated according to the position of the calibration tool locked onto the wafer platform by the centering device. At least one alignment mark is provided on the surface of the calibration tool for such purpose. The process is conducted at room temperature and any deviation from the preset position of the robot arm is recorded. The process can be repeated after temperature in the process chamber is increased to the process temperature for tungsten CVD at approximately 440° C., even though a low temperature calibration by the present invention novel calibration tool may be adequate.

The present invention novel self-centering calibration tool for a wafer platform, or heater, and a method for calibrating a wafer pedestal in a process chamber have therefore been amply described in the above descriptions and in the appended drawings of FIGS. 3A–3C.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiment of the invention in which an exclusive property or privilege is claimed are defined as follows:

What is claimed is:

1. A self-centering calibration tool for a wafer platform comprising:
   a circular wafer platform adapted for holding a wafer thereon, said platform having a raised edge projecting upwardly from a top surface of said platform, said raised edge having an undercut groove facing a center of said platform, and
   a circular calibration disc having at least one alignment mark on a top surface for aligning a robot arm and a centering device mounted juxtaposed to a bottom surface, said centering device being detachably mounted to said circular calibration disc by a bolt threadingly engaging a center aperture in said calibration disc and a center aperture in said centering device, said centering device comprising at least three legs extending radially outwardly from said center aperture equally spaced circumferentially from each other adapted for engaging said undercut groove in said wafer platform effectuating a self-centering calibration.

2. A self-centering calibration tool for a wafer platform according to claim 1, wherein said circular wafer platform being supported by a shaft portion for moving upwardly and downwardly.

3. A self-centering calibration tool for a wafer platform according to claim 1, wherein said top surface of said circular wafer platform further comprises a plurality of apertures adapted for slidingly engaging a plurality of lift pins.

4. A self-centering calibration tool for a wafer platform according to claim 1, wherein said top surface of said circular wafer platform further comprises a plurality of apertures adapted for engaging a plurality of guide pins.

5. A self-centering calibration tool for a wafer platform according to claim 1, wherein said undercut groove in said raised edge having a thickness of at least 1 mm.

6. A self-centering calibration tool for a wafer platform according to claim 1, wherein said undercut groove in said raised edge further comprises outlets for a cooling gas.

7. A self-centering calibration tool for a wafer platform according to claim 1, wherein said at least three legs of said centering device being bent at an angle of at least 30° when measured from a radius drawn from said center aperture of said centering device.

8. A self-centering calibration tool for a wafer platform according to claim 1, wherein said at least three legs of said centering device being bent at an angle of at least 60° when measured from a radius drawn from said center aperture of said centering device.

9. A self-centering calibration tool for a wafer platform according to claim 1, wherein said wafer platform is one used in a chemical vapor deposition chamber.

10. A self-centering calibration tool for a wafer platform according to claim 1, wherein said center apertures for said calibration disc and said centering device are provided with threads.

11. A method for calibrating the movement of a robot arm for loading a wafer onto a wafer platform comprising the steps of:
   providing a circular wafer platform adapted for holding a wafer thereon, said platform having a raised edge projecting upwardly from a top surface of said platform, said raised edge having an undercut groove facing a center of said platform,
   providing a circular calibration disc having at least one alignment mark on a top surface and a centering device mounted juxtaposed to a bottom surface, said centering device being detachably mounted to said circular calibration disc by a bolt threadingly engaging a center aperture in said calibration disc and a center aperture in said centering device, said centering device comprising at least three legs extending radially outwardly from said center aperture equally spaced circumferentially from each other,
   engaging said at least three legs in said undercut groove situated in said wafer platform effectuating a self-centering calibration, and
   calibrating a movement of a robot arm for loading a wafer onto said wafer platform.

12. A method for calibrating the movement of a robot arm for loading a wafer onto a wafer platform according to claim 11 flrther comprising the step of providing said circular wafer platform in a chemical vapor deposition chamber.

13. A method for calibrating the movement of a robot arm for loading a wafer onto a wafer platform according to claim 11 further comprising the step of calibrating a movement of said robot arm by loading a silicon wafer onto said wafer platform.

14. A method for calibrating the movement of a robot arm for loading a wafer onto a wafer platform according to claim 11 further comprising the step of deforming said at least three legs on said centering device to an angle of at least 30° when measured from a radius emanating from said center aperture.

15. A method for calibrating the movement of a robot arm for loading a wafer onto a wafer platform according to claim 11 further comprising the step of deforming said at least three legs on said center device to an angle of at least 60° when measured from a radius emanating from said center aperture.

16. A method for calibrating the movement of a robot arm for loading a wafer onto a wafer platform according to claim 11 further comprising the step of raising a plurality of lift pins in said wafer platform to unload a wafer positioned thereon.

17. A method for calibrating the movement of a robot arm for loading a wafer onto a wafer platform according to claim 11 further comprising the step of providing a plurality of openings in said undercut groove and flowing a cooling gas therethrough.

18. A method for calibrating the movement of a robot arm for loading a wafer onto a wafer platform according to claim 11 further comprising the step of evacuating air from a chemical vapor deposition chamber such that a pressure of not higher than $10^{-4}$ torr is maintained in said chamber.

* * * * *